(12) United States Patent
Dutta et al.

(10) Patent No.: US 9,770,759 B2
(45) Date of Patent: Sep. 26, 2017

(54) HIGHLY STRETCHABLE INTERCONNECT DEVICES AND SYSTEMS

(71) Applicant: Washington State University, Pullman, WA (US)

(72) Inventors: Indranath Dutta, Pullman, WA (US); Rahul Panat, Pullman, WA (US)

(73) Assignee: Washington State University, Pullman, WA (US)

( * ) Notice: Subject to any disclaimer, the term of this patent is extended or adjusted under 35 U.S.C. 154(b) by 5 days.

(21) Appl. No.: 14/839,933

(22) Filed: Aug. 29, 2015

(65) Prior Publication Data

US 2016/0170447 A1 Jun. 16, 2016

Related U.S. Application Data

(60) Provisional application No. 62/090,319, filed on Dec. 10, 2014.

(51) Int. Cl.
*B32B 3/00* (2006.01)
*B22F 3/105* (2006.01)
(Continued)

(52) U.S. Cl.
CPC ............ *B22F 3/1055* (2013.01); *G06F 1/163* (2013.01); *H01F 27/24* (2013.01);
(Continued)

(58) Field of Classification Search
CPC ....... B22F 3/1055; G06F 1/163; H05K 1/028; H05K 1/0296; H05K 1/0313; H05K 1/0393
See application file for complete search history.

(56) References Cited

U.S. PATENT DOCUMENTS 5,176,939 A 1/1993 Shepherd
6,798,052 B2 9/2004 Green
(Continued)

FOREIGN PATENT DOCUMENTS

JP 2006310360 11/2006

OTHER PUBLICATIONS

International Search Report and Written Opinion issued in PCT Application No. PCT/US15/47611 on Jan. 11, 2016, 12 pages.
(Continued)

*Primary Examiner* — Elizabeth Mulvaney
(74) *Attorney, Agent, or Firm* — Liang IP, PLLC

(57) ABSTRACT

Techniques for forming highly stretchable electronic interconnect devices are disclosed herein. In one embodiment, a method of fabricating an electronic interconnect device includes forming a layer of an adhesion material onto a surface of a substrate material capable of elastic and/or plastic deformation. The formed layer of the adhesion material has a plurality of adhesion material portions separated from one another on the surface of the substrate material. The method also includes depositing a layer of an interconnect material onto the formed layer of the adhesion material. The deposited interconnect material has regions that are not bonded or loosely bonded to corresponding regions of the substrate material, such that the interconnect material may be deformed more than the adhesion material attached to the substrate material. In certain embodiments, the interconnect material can also include a plurality of wrinkles on a surface facing away from the substrate material.

20 Claims, 7 Drawing Sheets

(51) Int. Cl.

| | |
|---|---|
| G06F 1/16 | (2006.01) |
| H05K 1/02 | (2006.01) |
| H05K 1/03 | (2006.01) |
| H05K 1/09 | (2006.01) |
| H05K 3/14 | (2006.01) |
| H05K 3/22 | (2006.01) |
| H05K 3/46 | (2006.01) |
| H01F 27/24 | (2006.01) |
| H01F 27/28 | (2006.01) |
| H01F 41/02 | (2006.01) |
| H01F 41/04 | (2006.01) |
| H01G 4/12 | (2006.01) |
| H01P 11/00 | (2006.01) |
| B33Y 10/00 | (2015.01) |
| B33Y 50/02 | (2015.01) |

(52) U.S. Cl.
CPC ..... *H01F 27/2804* (2013.01); *H01F 41/0206* (2013.01); *H01F 41/046* (2013.01); *H01G 4/1218* (2013.01); *H01P 11/001* (2013.01); *H05K 1/028* (2013.01); *H05K 1/0296* (2013.01); *H05K 1/0313* (2013.01); *H05K 1/0393* (2013.01); *H05K 1/09* (2013.01); *H05K 3/14* (2013.01); *H05K 3/22* (2013.01); *H05K 3/4644* (2013.01); *B22F 2003/1058* (2013.01); *B33Y 10/00* (2014.12); *B33Y 50/02* (2014.12); *H05K 1/0298* (2013.01); *H05K 2201/0162* (2013.01); *H05K 2203/0522* (2013.01)

(56) References Cited

U.S. PATENT DOCUMENTS

| | | |
|---|---|---|
| 2002/0179320 A1 | 12/2002 | Yu et al. |
| 2005/0205999 A1 | 9/2005 | Forbes et al. |
| 2008/0157235 A1 | 7/2008 | Rogers et al. |

OTHER PUBLICATIONS

Jones, Jet al. "Stretchable wavy metal interconnects." Journal of Vacuum Science & Technology A. Jul. 2004, vol. 22, No. 4, pp. 1723-1725.
Lacour, SP, et al. "Stretchable interconnects for elastic electronic surfaces." Proceedings of the IEEE. 2005, vol. 93, No. 8, pp. 1459-1467.
Chen, et al., Flexible active-matrix electronic ink display, Nature 2003, 423, (6936), 136-136.
Gelinck, et al., Flexible active-matrix displays and shift registers based on solution-processed organic transistors, Nature Materials 2004, 3, (2), 106-110.
Kim, et al., Low-Power Flexible Organic Light-Emitting Diode Display Device, Advanced Materials 2011, 23, (31), 3511.
Yoon, et al, Inkjet Printing of Conjugated Polymer Precursors on Paper Substrates for Colorimetric Sensing and Flexible Electrothermochromic Display, Advanced Materials 2011, 23, (46), 5492.
Ponce Wong et al., Flexible microfluidic normal force sensor skin for tactile feedback, Sensors and Actuators A: Physical 2012, 179, (0), 62-69.
Kim, et al., Stretchable and Foldable Silicon Integrated Circuits, Science 2008, 320, (5875), 507-511.
Ko, et al., A hemispherical electronic eye camera based on compressible silicon optoelectronics Nature 2008, 454, (7205), 748-753.
Kim, et al., Epidermal Electronics, Science 2011, 333, (6044), 838-843.
Farandos, et al., Contact Lens Sensors in Ocular Diagnostics, Advanced Healthcare Materials 2014.
Yung-Yu, et al., Novel Strain Relief Design for Multilayer Thin Film Stretchable Interconnects Electron Devices, IEEE Transactions on 2013, 60, (7), 2338-2345.
Hsu, et al., The effect of pitch on deformation behavior and the stretching-induced failure of a polymer-encapsulated stretchable circuit, Journal of Micromechanics and Microengineering 2010, 20, (7), 075036.
Taylor, et al. Planar patterned stretchable electrode arrays based on flexible printed circuits, Journal of Micromechanics and Microengineering 2013, 23, (10), 105004.
Zhang, et al., Mechanics of ultra-stretchable self-similar serpentine interconnects, Acta Materialia 2013, 61, (20), 7816-7827.
Zhang, et al., Experimental and Theoretical Studies of Serpentine Microstructures Bonded to Prestrained Elastomers for Stretchable Electronics Advanced Functional Materials 2014, 24, (14), 2028-2037.
Hsu, et al., The effects of encapsulation on deformation behavior and failure mechanisms of stretchable interconnects, Thin Solid Films 2011, 519, (7), 2225-2234.
Jablonski, et al., Reliability of a stretchable interconnect utilizing terminated, in-plane meandered copper conductor Microelectronics Reliability 2013, 53, (7), 956-963.
Gonzalez, et al., Design and implementation of flexible and stretchable systems, Microelectronics Reliability 2011, 51, (6), 1069-1076.
Béfahy, et al., Stretchable helical gold conductor on silicone rubber microwire, Applied Physics Letters 2007, 91, (14), 141911.
Rogers, et al., Materials and Mechanics for Stretchable Electronics, Science 2010, 327, (5973), 1603-1607.
Kim, et al., A robust polymer microcable structure for flexible devices, Applied Physics Letters 2013, 102, (3), 033506.
Khang, et al., A Stretchable Form of Single-Crystal Silicon for High-Performance Electronics on Rubber Substrates Science 2006, 311, (5758), 208-212.
Lv, et al., Archimedean spiral design for extremely stretchable interconnects, Extreme Mechanics Letters 2014.
Yung-Yu, et al., Design for reliability of multi-layer stretchable interconnects, Journal of Micromechanics and Microengineering 2014, 24, (9), 095014.
Wagner, et al., Materials for stretchable electronics, Mrs Bulletin 2012, 37, (03), 207-213.
Xiang, et al., High ductility of a metal film adherent on a polymer substrate, Applied Physics Letters 2005, 87, (16), 161910.
Lacour, et al., Stretchable Interconnects for Elastic Electronic Surfaces, Proceedings of the IEEE 2005, 93, (8), 1459-1467.
Jones, et al., Stretchable wavy metal interconnects, Journal of Vacuum Science & Technology A 2004, 22, (4), 1723-1725.
Akogwu, et al., Large strain deformation and cracking of nano-scale gold films on PDMS substrate, Materials Science and Engineering: B 2010, 170, (1), 32-40.
Lu, et al., Metal films on polymer substrates stretched beyond 50%, Applied Physics Letters 2007, 91, (22), 221909.
Li, et al. Deformability of thin metal films on elastomer substrates, International Journal of Solids and Structures 2006, 43, (7), 2351-2363.
Li, et al., Delocalizing strain in a thin metal film on a polymer substrate, Mechanics of Materials 2005, 37, (2), 261-273.
Vandeparre, et al., Localization of Folds and Cracks in Thin Metal Films Coated on Flexible Elastomer Foams, Advanced Materials 2013, 25, (22), 3117-3121.
Xia, et al., Crack patterns in thin films, Journal of the Mechanics and Physics of Solids 2000, 48, (6), 1107-1131.
Bowden, et al., Spontaneous formation of ordered structures in thin filmsofmetals supported on an elastomeric polymer, Nature 1998, 393, (6681), 146-149.
Song, et al., Buckling of a stiff thin film on a compliant substrate in large deformation, International Journal of Solids and Structures 2008, 45, (10), 3107-3121.
International Preliminary Report on Patentability issued in PCT Application No. PCT/US15/47611 on Jun. 22, 2017, 5 pages.

0% strain 8.3% strain 38.5% strain

Release

HIGHLY STRETCHABLE INTERCONNECT DEVICES AND SYSTEMS

CROSS-REFERENCE TO RELATED APPLICATION(S)

This application is a Non-provisional Application of and claims priority to U.S. Provisional Application No. 62/090,319, filed on Dec. 10, 2014.

BACKGROUND

Wearable devices are clothing or accessories incorporating computing, communications, or other electronic technologies. Examples of such wearable devices include flexible displays, robotic skins, stretchable circuits, biosensors, hemispherical electronic eyes, epidermal electronics, cardiac sensors, and diagnostic contact lenses. Wearable devices are a good example of the Internet of Things ("IoT"). Proliferation of such wearable devices is predicted to lead to an IoT revolution in the near future.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

Wearable device typically utilize flexible electronic interconnects that are heterogeneous metal-polymer systems expected to sustain large deformation without failure. Conventional techniques for providing strain-tolerant interconnects include creating serpentine metal structures with either in-plane or out-of-plane waves, using porous substrates, or using highly ductile materials such as gold. The wavy and helical serpentine patterns may not allow high-density packing of interconnects, while using gold can be cost prohibitive.

Several embodiments of the disclosed technology are directed to providing highly stretchable interconnect devices and systems using a discontinuous adhesion material interposed between and bonding an interconnect material to a substrate material. Without being bound by theory, it is believed that the discontinuous adhesion materials can facilitate a large degree of deformation without physical fracture and/or electrical disconnect in the interconnect device. It is believed that islands of the discontinuous adhesion material can dislocate, shift, or otherwise move relative to one another during stretching without delamination from the substrate material or the interconnect material, and thus providing strong adhesion therebetween while accommodating large strain.

BRIEF DESCRIPTION OF THE DRAWINGS

FIGS. 6A and 6B are scanning electron microscope ("SEM") and white light images of an example interconnect device before and after being stressed under a strain in accordance with embodiments of the disclosed technology.

DETAILED DESCRIPTION

Figure 1A:
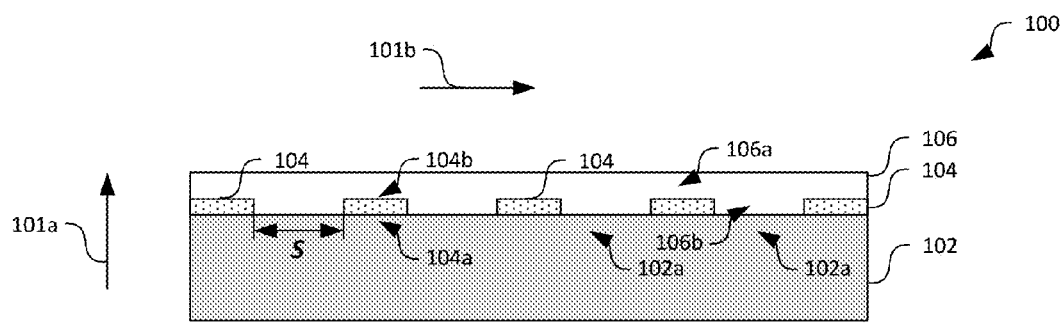
FIG. 1A is a schematic cross-sectional diagram of an interconnect device in accordance with embodiments of the disclosed technology.

Certain embodiments of systems, devices, articles of manufacture, and processes for providing highly stretchable interconnect devices and systems are described below. In the following description, specific details of components are included to provide a thorough understanding of certain embodiments of the disclosed technology. A person skilled in the relevant art will also understand that the disclosed technology may have additional embodiments or may be practiced without several of the details of the embodiments described below with reference to FIGS. 1A-6C.

As used herein, the term "interconnect" or "interconnect device" generally refers to a component, apparatus, or system configured to electrically connect two or more other components, apparatus, or systems. One example interconnect device is described in more detail with reference to FIGS. 1A and 1B below. The term "flexible" or "stretchable" generally refers to an ability to undergo linear or non-linear elastic and plastic deformation under a strain. A flexible material suitable as a substrate can include a polymeric material such as polyimide, rubber, silicone, and PDMS. Also used herein, the term "elastic-plastic metal" generally refers to a metal that shows elastic deformation under a strain of less than about 5-10% and plastic deformation under a strain in excess of about 5-10%. One example elastic-plastic metal is indium, which yields at a very low stress at room temperature (less than or equal to about 3 MPa) and can undergo creep deformation and recrystallization at room temperature. Further, as used herein, the term "strain" generally refers to a ratio or percentage of deformation to an initial dimension of a material body in which a force is applied. For example, in certain embodiments, a strain can be expressed as a change in length ΔL per unit of the original length L of a material body. In other embodiments, a strain can also be expressed as a change in diameter, width, height, or other suitable dimensions.

Flexible electronic devices typically contain components (e.g., sensors, power sources, logic, memory, and communication devices) connected with one another on a flexible substrate using conductive interconnects. However, design and manufacturing of such metallic interconnects that have high spatial density and can be reliably stretched to large strains has become a challenge. Difficulties involved include (a) strain compatibility of different components at the interfaces, (b) minimal to no cracking in interconnects that result in acceptable increase in resistivity under stretching, and (c) recovery of resistivity upon release of the strain.

Conventional techniques to improve interconnect stretchability include creating in-plane serpentine structures of conductive films, non-planar buckling structures, or other in-plane geometries. In addition to a low interconnect density, serpentine structures can also increase interconnect lengths and associated resistive power losses. Thin ductile films of gold (Au) have been shown to have good stretchability over other metals. Films of copper (Cu) over a polyimide substrate show severe cracking at a strain of about 20-30% even if the films of copper are strongly bonded to the polyimide substrate.

Several embodiments of the disclosed technology can provide highly stretchable interconnect devices by interposing a discontinuous adhesion material between an interconnect material and a substrate material. In certain embodiments, the adhesion material can be discontinuous along one or more in-plane directions. In other embodiments, the adhesion material can form a plurality of islands interposed between the interconnect material and the substrate material, as described in more detail below with reference to FIGS. 1A-1C.

Figure 1B:
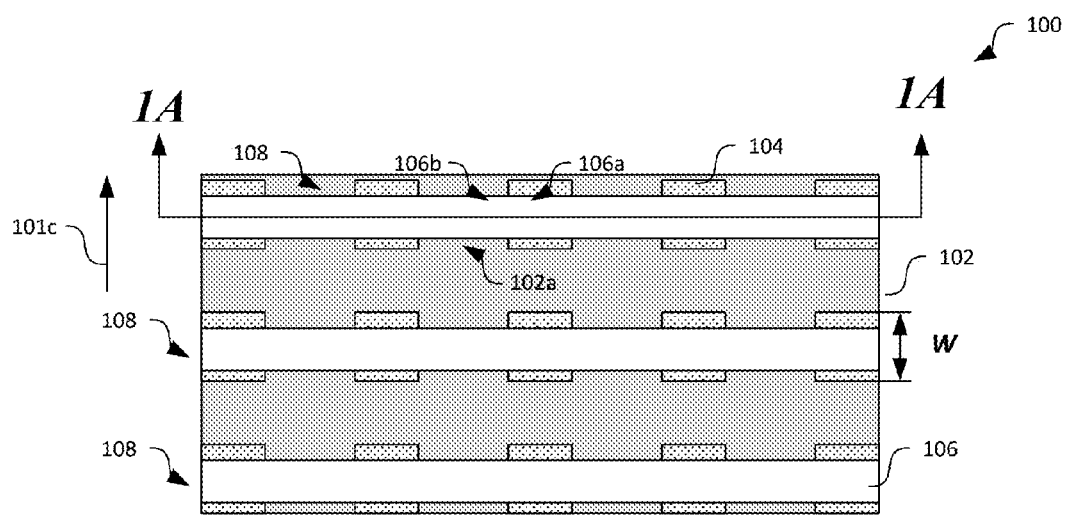
FIG. 1B is a schematic top view diagram of the interconnect device in FIG. 1A.

FIG. 1A is a schematic cross-sectional diagram of an interconnect device 100 in accordance with embodiments of the disclosed technology. FIG. 1B is a schematic top view diagram of the interconnect device 100 in FIG. 1A. As shown in FIG. 1A, the interconnect device 100 can include a substrate material 102, an interconnect material 106 proximate the substrate material 102, and an adhesion material 104 interposed between the substrate material 102 and the interconnect material 106. Even though the interconnect device 100 is shown in FIG. 1A as having particular components, in other embodiments, the interconnect device 100 can also include insulation materials, encapsulation materials, and/or other suitable materials.

The substrate material 102 can include a flexible material capable of elastic and/or plastic deformation due to stretching, twisting, bending, or other types of deformation. In certain embodiments, the substrate material 102 can include a polymeric material. Example polymeric materials can include PDMS, polyimide, poly(p-xylylene), or other suitable polymeric materials. In one embodiment, the substrate material 102 can include a film of the polymeric material. In other embodiments, the substrate material 102 can include a ribbon, a strip, or have other suitable configurations, structures, or dimensions.

The interconnect material 106 can include an elastic-plastic conducting material such as a metal or metal alloy. In certain embodiments, the interconnect material 106 can include indium (In), copper (Cu), aluminum (Al), silver (Ag), gold (Au), tin (Sn), or an alloy of the foregoing elements. In other embodiments, the interconnect material 106 can include other metals or metal alloys suitable to form electrical interconnects. In one embodiment, the interconnect material 106 can be formed as one or more closely packed conductive traces. For example, as shown in FIG. 1B, the interconnect material 106 can be formed into three traces 108. In additional examples, the interconnect material 106 can be formed into any suitable number of traces or other suitable electrical conduits. In other embodiments, the interconnect material 106 can be formed as loosely packed conductive traces or other suitable electrical conduits.

Referring back to FIG. 1A, the adhesion material 104 can include a material that can form strong bonds (e.g., covalent bonds) with both the substrate material 102 and the interconnect material 106. For example, in one embodiment, the adhesion material 104 can include chromium (Cr) or chromium oxide. In other embodiments, the adhesion material 104 can also include titanium (Ti), nickel (Ni), tantalum (Ta), or an oxide or nitride thereof. In other embodiments, the adhesion material 104 can also include other metals, metal alloys or compounds thereof that adhere to both the substrate and interconnect materials 106 and 102. As shown in FIG. 1A, the adhesion material 104 can form a first bond with the substrate material 102 at a first interface 104a. The adhesive material 104 can also form a second bond with the interconnect material 106 at a second interface 104b. The first and second interfaces 104a and 104b are spaced apart from each other along a first direction 101a.

The adhesion material 104 can be discontinuous in one or more directions that are generally perpendicular to the first direction 101a. For example, as shown in FIG. 1A, the adhesion material 104 can be discontinuous along a second direction 101b that is generally perpendicular to the first direction 101a. In another example, as shown in FIG. 1B, the adhesion material 104 can be discontinuous along a third direction 101c that is generally perpendicular to the first direction 101a. In further examples, the adhesion material 104 can be discontinuous along any direction that is in a plane generally perpendicular to the first direction 101a.

As shown in FIGS. 1A and 1B, the discontinuous adhesive material 104 includes a plurality of adhesion material portions or "islands" spaced apart from one another along the second and third directions 101b and 101c. In the illustrated embodiment, the individual adhesion material portions have generally similar length, height, and width, and are spaced apart from a neighboring adhesion material portion by generally the same separation distance S. In other embodiments, the adhesion material portions can have one or more different dimensions from one another, and can also have a different or random arrangement. Several examples are described in more detail below with reference to FIGS. 2A-2C.

As shown in FIGS. 1A and 1B, due to the interposed discontinuous adhesion material 104, the interconnect material 106 can include a first region 106a that generally corresponds to the individual adhesion material portions and a second region 106b that is not bonded or loosely bonded to corresponding regions 102a of the substrate material 102. As discussed in more detail below with reference to FIGS. 1C and 1D, the second region 106b are believed to effect relative deformation under a strain while the adhesion material 104 anchors the first region 106a. As such, the adhesion material 104 can facilitate high stretchability of the interconnect device 100 under large strains by enlarge the separation distance S between neighboring adhesion material portions. In addition, some deformation of the interconnect material 106 over the adhesion material portions may also occur.

Figure 1C:
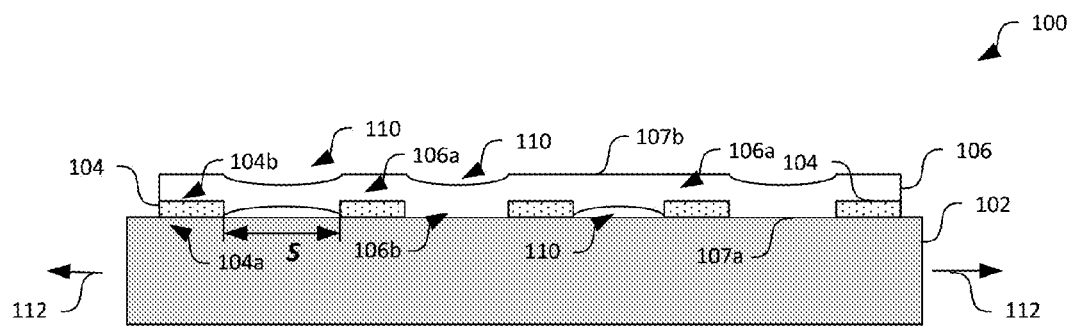
FIG. 1C is a schematic cross-sectional diagram of the interconnect device in FIG. 1A under a linear strain in accordance with embodiments of the disclosed technology.

FIG. 1C is a schematic cross-sectional diagram of the interconnect device in FIG. 1A under a linear strain 112 in accordance with embodiments of the disclosed technology. Even though the ability of the interconnect device 100 to accommodate large strain is discussed below using a unidirectional planar (i.e. linear) strain as an example, the interconnect device 100 can also accommodate large strain due to multi-directional planar strain, non-planar strain such as bending, twisting, or other suitable types of strain induced by external or internal deformation.

As shown in FIG. 1C, under the linear strain 112, it is believed that due to the strong first and second bonds of the adhesion material 104 with the substrate material 102 and the interconnect material 106 at the first and second interfaces 104a and 104b, respectively, the adhesion material 104 as well as the first region 106a of the interconnect material 106 extend generally in conformance with the substrate material 102. However, the second region 106b of the interconnect material 106, being much less constrained by adhesion to the substrate material 102, can have elastic and/or elastic-plastic deformations 110 to accommodate enlargement of the separation distances S between neighboring adhesion material portions. In the illustrated embodiment, the deformations 110 of the second region 106b can include "necking" or other suitable tensile deformations at a first surface 107a of the interconnect material 106 proximate to the substrate material 102, at a second surface 107b opposite the first surface 107a, or at both the first and second surfaces 107a and 107b. In other embodiments, the deformations 110 can have other suitable configurations and/or dimensions. Though not shown in FIG. 1C, in certain embodiments, the first region 106a of the interconnect material 106 may also extend or otherwise deform during under the linear strain 112.

Figure 1D:
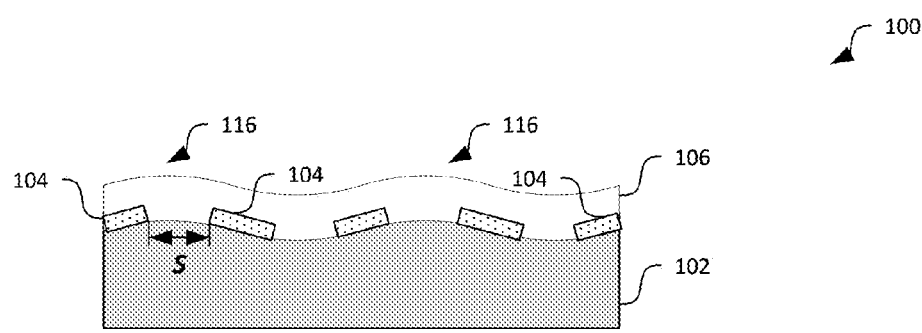
FIG. 1D is a schematic cross-sectional diagram of the interconnect device in FIG. 1A subsequent to removal of the linear strain shown in FIG. 1C in accordance with embodiments of the disclosed technology.

FIG. 1D is a schematic cross-sectional diagram of the interconnect device 100 in FIG. 1A subsequent to removal of the linear strain 112 shown in FIG. 1C in accordance with embodiments of the disclosed technology. As shown in FIG. 1D, subsequent to removal of the linear strain 112 shown in FIG. 1C, the substrate material 102 can contract due to its elasticity and/or viscoelasticity. The second region 106b of the interconnect material 106 can also contract and deform to accommodate the now reduced separation distance S between neighboring adhesion material portions, and thus forming "wrinkles" 116 with ridges and troughs.

As described in more detail below with reference to the Experiment section, example interconnect devices generally similar in configuration as that shown in FIG. 1A and using an indium (In) layer over a polydimethylsiloxane ("PDMS") elastomer with a discontinuous chromium (Cr) layer were studied. The experiments showed that the example interconnect device could be stretched to a large linear strain (e.g., greater than about 100%) generally without visible cracks. In-situ electrical resistance measurements during experiments showed that electrical continuity was maintained until >100% strain and resistivity of the indium layer increased about 70% for a strain up to about 90%. Thus, several embodiments of the interconnect device 100 can be highly stretchable even without using a porous substrate, geometrical manipulations like serpentines, or an expensive metal such as gold. Several embodiments of the interconnect device 100 can also allow high density circuits to be formed with the interconnect material 106 without using geometrical manipulation of the interconnect material 106.

Figure 2A:
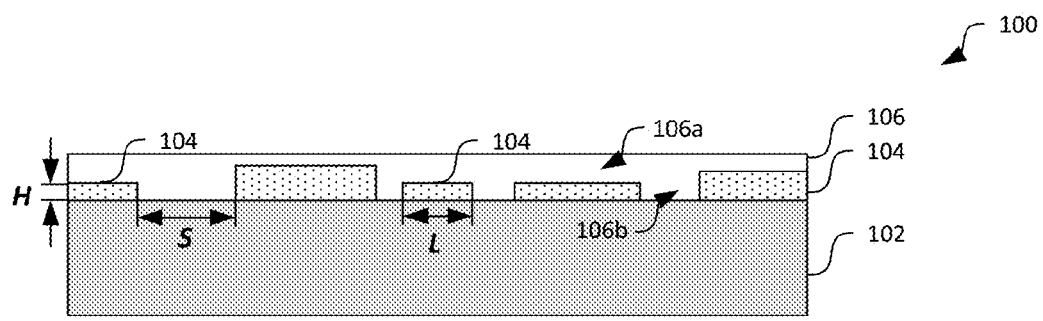
FIGS. 2A-2C are schematic cross-sectional diagrams of additional embodiments of an interconnect device in accordance with embodiments of the disclosed technology.
Figure 2B:
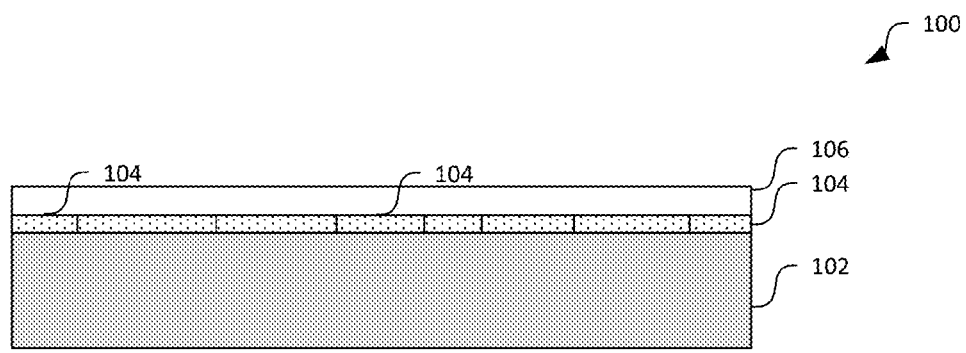
Figure 2C:
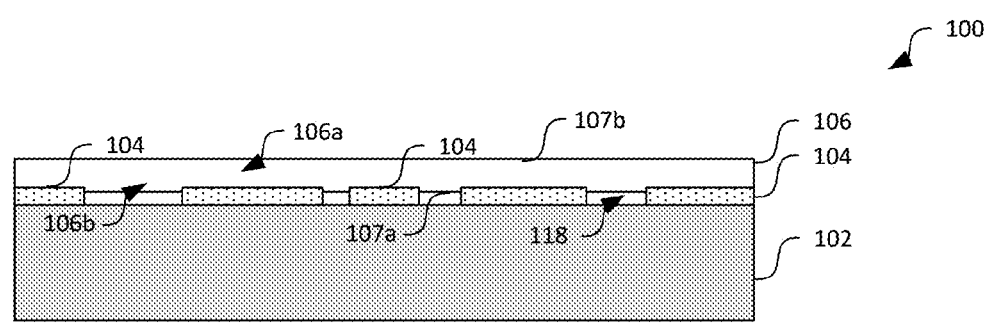

Even though particular configurations and/or dimension of various components of the interconnect device 100 are shown in FIGS. 1A-1D for illustration purposes, in other embodiments, the interconnect device 100 can have other suitable configurations and/or dimensions. For example, FIGS. 2A-2C are schematic cross-sectional diagrams of additional embodiments of an interconnect device 100 in accordance with embodiments of the disclosed technology. As shown in FIG. 2A, the adhesion material portions of the adhesion material 104 can individually have different length L, height H, and width W (shown in FIG. 1B). The individual adhesion material portions can also be spaced apart by different separation distances S. As shown in FIG. 2B, the individual adhesion material portions can also abutting neighboring adhesion material portions. However, each of the adhesion material portions is still separate from neighboring adhesion material portions such that the individual adhesion material portions can move relative to one another. As shown in FIG. 2C, the second region 106b of the interconnect material 106 can be un-bonded from the substrate material 102. As such, a gap 118 may exist between the first surface 107a of the interconnect material 106 and the substrate material 102.

Figure 3A:
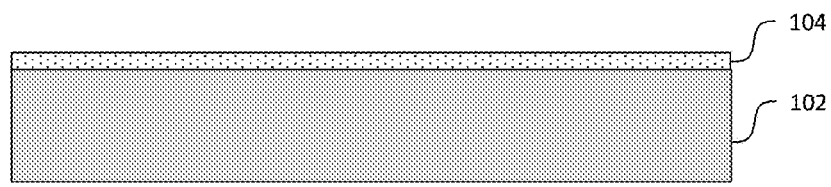
FIGS. 3A-3D are schematic cross-sectional diagrams illustrating an example process of forming an interconnect device in accordance with embodiments of the disclosed technology.

FIGS. 3A-3D are schematic cross-sectional diagrams illustrating an example process of forming an interconnect device 100 of FIG. 1A in accordance with embodiments of the disclosed technology. As shown in FIG. 3A, the process can include depositing the adhesion material 104 onto the substrate material 102. The adhesion material 104 can be deposited via chemical vapor deposition, atomic layer deposition, sputtering, electrodeposition, or other suitable techniques. In one embodiment, the adhesion material 104 can have a thickness of about 3-5 nm. In other embodiments, the adhesion material 104 can have other suitable thickness values.

Figure 3B:
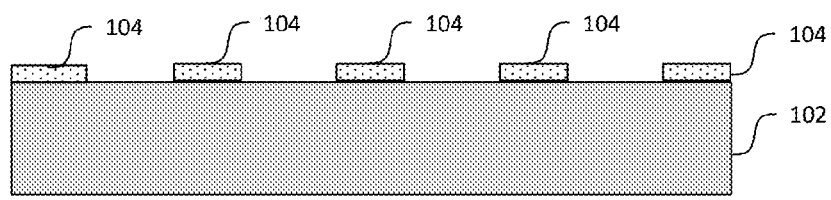

As shown in FIG. 3B, the process can then include forming a plurality of adhesion material portions on the substrate material 102. In one embodiment, the plurality of adhesion material portions can be formed by fracturing the deposited adhesion material 104 under mechanical and/or thermal stress. For example, the deposited adhesion material 104 may be fractured by stretching, bending, twisting, or applying other suitable mechanical stress. In another embodiment, parts of the deposited adhesion material 104 can be removed using, for example, wet etching, dry etching, laser ablation, or other suitable techniques. In yet another embodiment, the adhesion material 104 may be deposited with a mask or stencil on the substrate material 102. In other embodiments, the adhesion material 104 may undergo other suitable processing to form a discourteous layer on the substrate material 102.

Figure 3C:
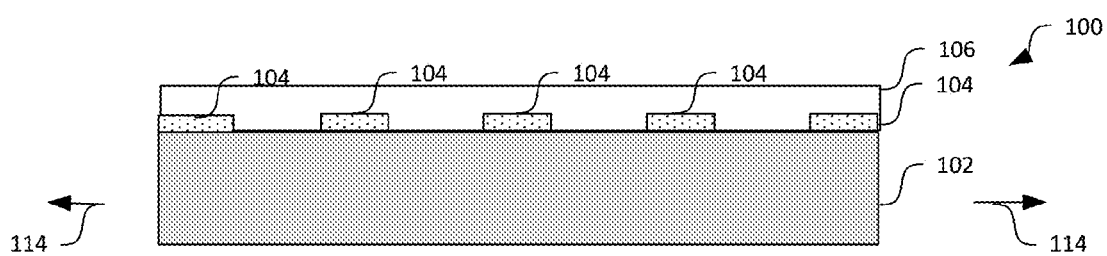

As shown in FIG. 3C, the process also include depositing the interconnect material 106 onto the substrate material 102 with the discontinuous adhesion material 104. The interconnect material 106 can be deposited via chemical vapor deposition, atomic layer deposition, sputtering, electrodeposition, other suitable techniques, or a combination of at least some of the foregoing techniques. In one embodiment, the interconnect material 106 can have a thickness of about 100-500 nm. In other embodiments, the interconnect material 106 can have a thickness of about 1-10 μm or other suitable thickness values.

Figure 3D:
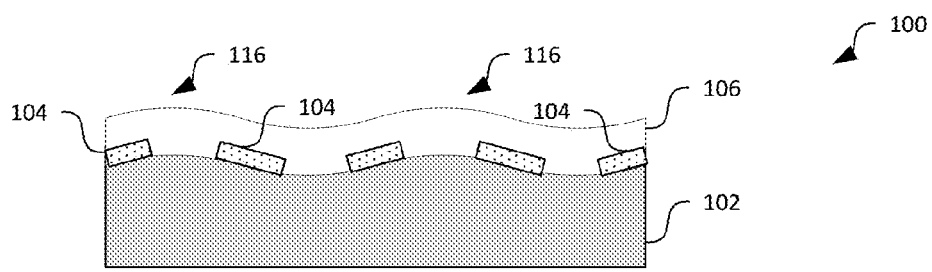

In certain embodiments, the interconnect material 106 can be deposited onto the discontinuous adhesion material 104 while the substrate material 102 is not under mechanical and/or thermal stress. Subsequent to the deposition of the interconnect material 106, mechanical and/or thermal stress may be applied to the formed interconnect device 100, for example, as shown by arrows 114. Upon release of the mechanical and/or thermal stress, a plurality of ridges and troughs or "wrinkles" 116, which are believed to further enhance stretchability of the interconnect device 100 may be formed, as shown in FIG. 3D. In other embodiments, the interconnect material 106 can be deposited while the substrate material 102 having the deposited adhesion material portions is under a mechanical and/or thermal stress, as shown by the arrows 114. Subsequent to depositing the interconnect material 106, removal of the mechanical and/or thermal stress can result in formation of the plurality of "wrinkles" 116.

Experiments

Example interconnect devices generally similar to that shown in FIGS. 1A and 1B were constructed and their stretchability tested as discussed in more detail below.

The experiments demonstrated an interconnect device with unprecedented interconnect stretchability with linear strain greater than about 100% without mechanical or electrical failure. The example interconnect device was constructed using indium as the interconnect material and PDMS as substrate material with a discontinuous intermediate material of chromium. The experiments showed that a resistivity increase is about 50-70% during stretching and increased only in the initial half of the stretching and remains generally stable up to about 100% strain. Failures happened in PDMS, indicating that the stretchability of the interconnect device is limited only by that of the substrate material. The mechanisms that allow such a high stretchability are believed to include the high plastic deformation of the interconnect material and movement of the adhesion material portions during stretching.

Materials and Experiment Methods

The interconnect material used was indium. PDMS was chosen as the substrate material and was prepared using Sylgard 184 Silicone Elastomer Kit with the elastomer and the curing agent were mixed (ratio of 10 parts to 1 part by weight, respectively) thoroughly using a stirrer, followed by 20 min de-bubbling (Cole-Parmer Ultrasonic Bath, model 08895-43) and curing for 3 hours at 80° C. The PDMS surface was treated with 100 W atmospheric oxygen plasma for 1 min (Surfx Atomflo 400). Large PDMS blocks were prepared and cut into a planar dog-bone shape to facilitate stretching.

A thin layer of chromium (about 3 nm to about 5 nm) followed by an indium film of about 1 μm thickness were deposited using magnetron sputtering (BOC Edwards Auto 306). Indium film of about 5 μm was then electroplated using an Indium Sulfamate bath (Indium Corporation, USA). The total thickness of the indium was confirmed using a scanning white light interferometer (Zygo NewView 6300). Deposition of metals and electroplating are done at room temperature. The samples were stretched at a displacement rate of 0.035 mm/s, which is equivalent to a strain rate of $1.3 \times 10^{-3}$/s on indium. 4-wire resistance measurements of the indium film were taken during stretching.

Experimental Results

A maximum strain obtained was about 106%, while strain levels of 70 to 106% were repeatedly obtained prior to failure on additional samples. The failure occurred in the PDMS rather than in the indium film in all the cases. The Indium films did not show obvious signs of cracking.

Figure 4:
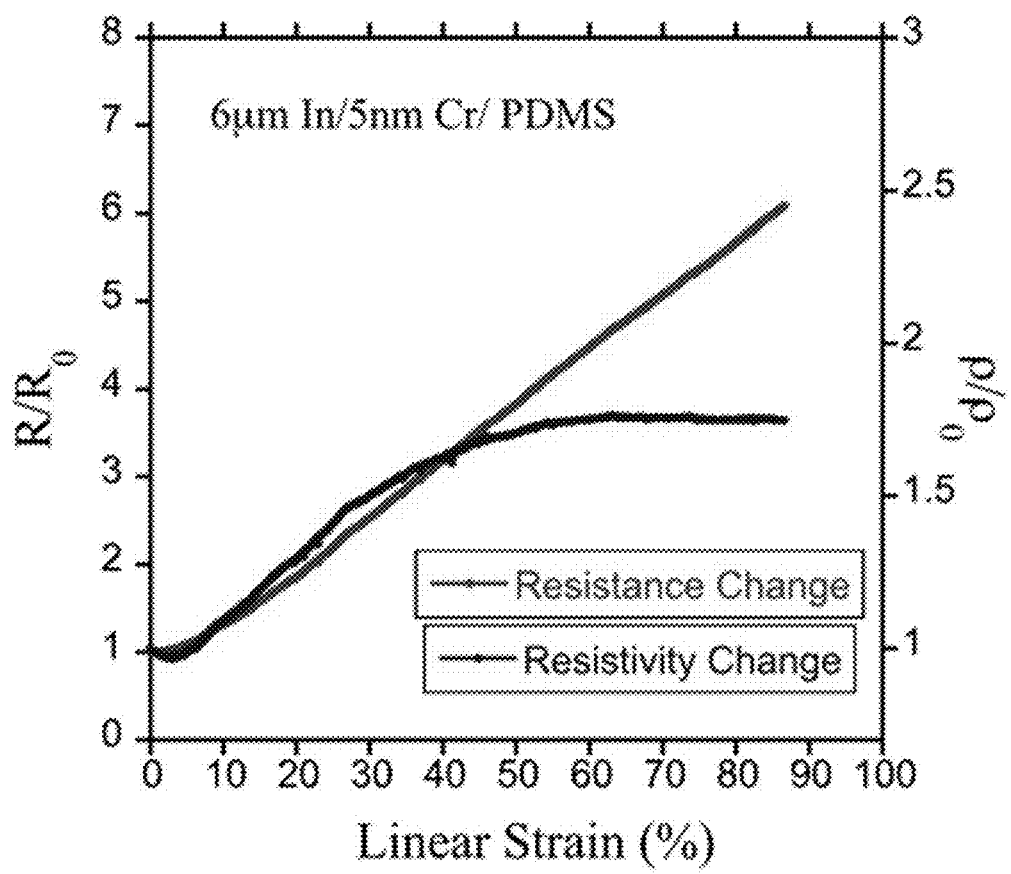
FIG. 4 is an example resistance and resistivity change versus strain plot related to an interconnect device configured in accordance with embodiments of the disclosed technology.

For plastic deformation, the indium film volume remained generally constant during deformation and the film resistance increased because of increase in film length and resulting decrease in cross section area. Resistivity, $\rho$, at any time during stretching can be compared to the initial resistivity $\rho_0$ as, $$\frac{\rho}{\rho_0} = \frac{R}{R_0}\left(\frac{L_0}{L}\right)^2$$

where $L_0$ and $L$, and $R_0$ and $R$ are the initial and instantaneous length and resistance respectively. FIG. 4 shows resistance and the resistivity change of the indium film as a function of the strain, respectively. As shown in FIG. 4, although the resistivity increased initially, i.e., for strain up to about 30%, the resistivity remained generally stable thereafter. The foregoing results suggest that either recovery or dynamic recrystallization can limit the growth of dislocation density, or that further plasticity can be concentrated near expanding defects (e.g., micro-cracks) that can limit increases of plastic strain in the rest of the film.

Loading to Large Strain

Figure 5A:
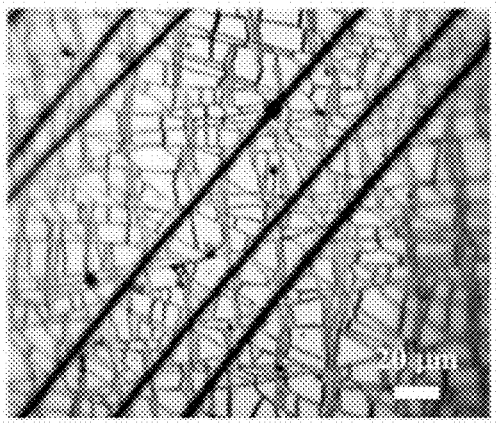
FIGS. 5A-5D are schematic diagrams illustrating an example interconnect device under various strain conditions in accordance with embodiments of the disclosed technology.

As indicated in FIG. 4, the Indium film was stretched to a strain of about 90% over the PDMS with an increase in the resistivity of about 50-70%. Experiments were conducted to explore the mechanism of large strain accommodation of the indium film at the Indium-Cr-PDMS interface of the example interconnect device. A chromium film of about 3-5nm thickness was deposited over the PDMS. The as-deposited chromium film showed irregular channel cracks under zero strain, as shown in FIG. 5A. The distance between the cracks is about 2-10 μm, while that for cracks with larger spacing is about 20-100 μm. The crack pattern indicates a biaxial stress on the chromium film during deposition.

Figure 5B:
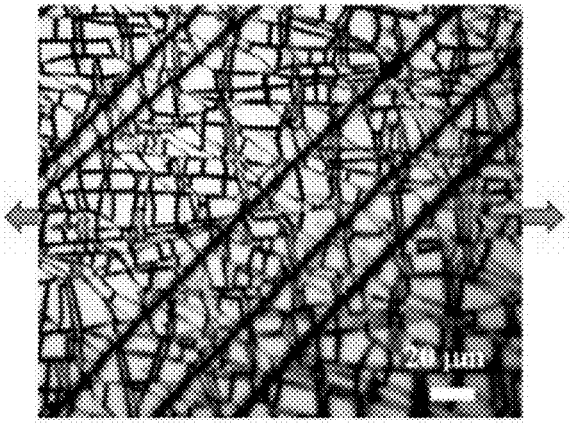
Figure 5C:
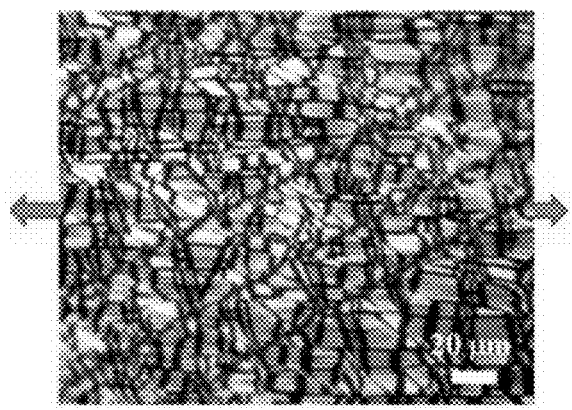
Figure 5D:
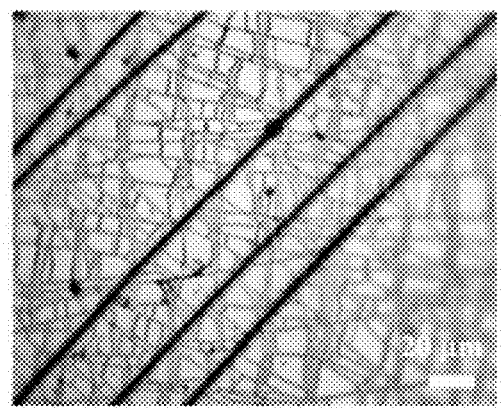

The PDMS with the chromium film was then stretched to about 39% strain and the same location was imaged under an optical microscope to observe if additional cracks are formed and/or the existing channel cracks grow. The optical images of the cracks at 0%, 8%, and 39% strain at the same location are shown in FIGS. 5A-5C, respectively, for in-plane loading in the horizontal direction. Clearly, the distance between the cracks (i.e. the dark regions between the cracks) have increased during elongation. FIG. 5C shows wrinkles in the direction perpendicular to the loading, indicating a contraction in the normal direction. FIG. 5D shows the same location after relaxation from the 39% strain. Comparing FIGS. 5A and 5D shows that the chromium film did not show a large amount of additional cracking.

Unloading from Large Strain

Under large strain, the indium film is expected to have undergone elastic-plastic deformation, while the PDMS elastomer is expected to be under viscoelastic deformation. Upon release, the viscoelastic recovery of the PDMS is expected to be much higher than that for the indium. Such incompatibility of a relatively stiff elastic film and an elastomer is believed to result in formation of surface wrinkles. The microstructure in FIG. 6A shows a SEM image of the initial Indium surface with about 2.5-3.5 μm feature size.

Figure 6C:
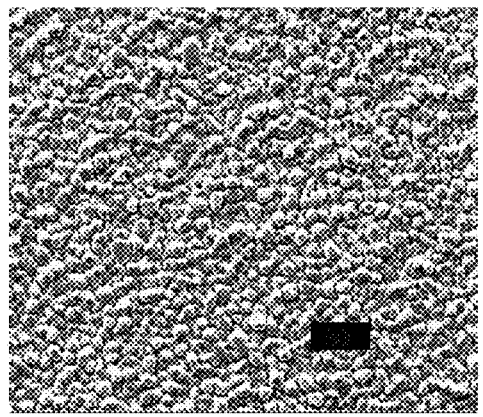
FIG. 6C is a white light interferometer image of the example interconnect device shown in FIG. 6B.
Figure 6C:
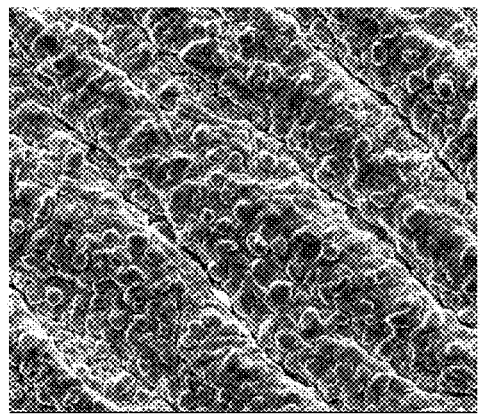
Figure 6C:
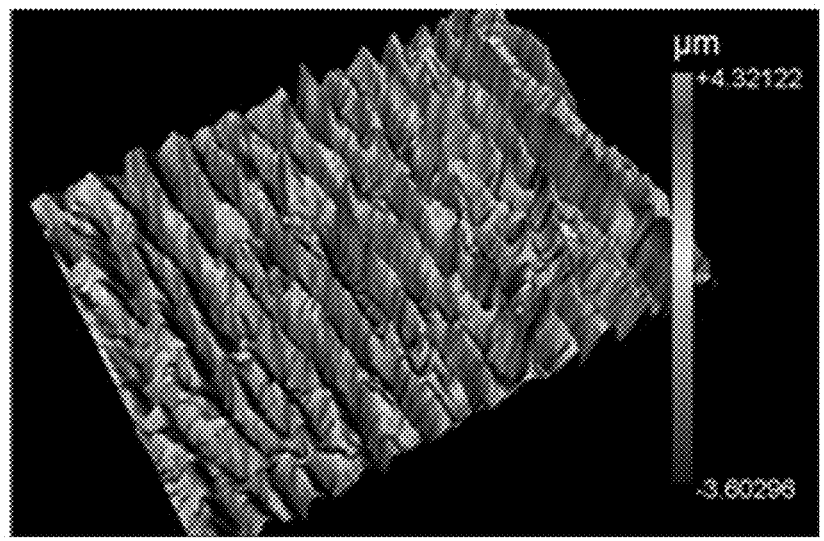

Upon stretching to about 100% strain and subsequent release, the Indium film has formed wrinkles as seen in the SEM micrograph of FIG. 6B. The surface profile of a region about 280 μm by 210 μm is shown in FIG. 6C, where the wrinkles normal to the direction of loading are clearly visible with a wavelength of about 18-20 μm and an amplitude of about 2-4 μm. The profile normal to the wrinkles gives an root-mean-square roughness of about 2 μm and Ra value of about 1.66 μm. To further identify if the underlying PDMS has deformed, the indium film was etched out using a 4-nitrophenol and sodium hydroxide solution. The resulting PDMS surface also showed wrinkles. The PDMS thus deformed with the indium film.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. An electronic interconnect device, comprising:
   a substrate material;
   an interconnect material proximate the substrate material along a first direction, the interconnect material including an elastic-plastic metal; and
   an adhesion material interposed between the substrate material and the interconnect material, wherein:
      the adhesion material is bonded with the substrate material at a first interface and bonded with the interconnect material at a second interface that is spaced apart from the first interface along the first direction; and
      the adhesion material is discontinuous along a second direction generally perpendicular to the first direction, wherein the interconnect material includes regions loosely bonded to corresponding regions of the substrate material such that the regions of the interconnect material are capable of relative movement with respect to the corresponding regions of the substrate material without being delaminated from the adhesion material.

2. The electronic interconnect device of claim 1 wherein the adhesion material include a plurality of adhesion material portions individually separated from other neighboring adhesion material portions along the second direction.

3. The electronic interconnect device of claim 1 wherein the adhesion material include a plurality of adhesion material portions individually separated from and abutting other neighboring adhesion material portions along the second direction.

4. The electronic interconnect device of claim 1 wherein the adhesion material include a plurality of adhesion material portions individually separated from other neighboring adhesion material portions by a separation distance along the second direction, the separation distance being variable when the electronic interconnect device is under a strain.

5. The electronic interconnect device of claim 1 wherein the adhesion material include a plurality of adhesion material portions individually separated from other neighboring adhesion material portions, and wherein the adhesion material portions are arranged randomly along the second direction.

6. The electronic interconnect device of claim 1 wherein the adhesion material include a plurality of adhesion material portions individually separated from other neighboring adhesion material portions by the same separation distance along the second direction.

7. The electronic interconnect device of claim 1 wherein:
   the substrate material includes a polymeric material capable of at least one of elastic or plastic deformation;
   the adhesion material includes chromium (Cr), titanium (Ti), aluminum (Al), nickel (Ni), tantalum (Ta), or an oxide or nitride thereof; and
   the interconnect material includes indium (In), tin (Sn), gold (Au) or copper (Cu).

8. The electronic interconnect device of claim 1 wherein the interconnect material includes one or more other regions not bonded to corresponding regions of the substrate material.

9. The electronic interconnect device of claim 1 wherein adhesion material is also discontinuous along a third direction generally perpendicular to the first direction and to the second direction.

10. An electronic interconnect device, comprising:
    a substrate material;
    an interconnect material proximate the substrate material, the interconnect material including an elastic-plastic metal and having a first surface proximate the substrate material and a second surface opposite the first surface, wherein the interconnect material includes a plurality of wrinkles on the second surface; and
    an adhesion material interposed between the substrate material and the interconnect material, wherein:
       the adhesion material is bonded with the substrate material at a first interface and bonded with the interconnect material at a second interface; and
       the interconnect material includes regions at the second interface that are not bonded or loosely bonded to the corresponding regions of the substrate material at the first interface such that the regions of the interconnect material are capable of relative movement with respect to the corresponding regions of the substrate material without being delaminated from the adhesion material.

11. The electronic interconnect device of claim 10 wherein:
    the interconnect material is spaced apart from the substrate material along a first direction; and
    the regions of the interconnect material at the second interface are capable of relative movement with respect to the corresponding regions of the substrate material at the first interface along a second direction generally perpendicular to the first direction.

12. The electronic interconnect device of claim 10 wherein:
    the interconnect material is spaced apart from the substrate material along a direction; and
    the regions of the interconnect material at the second interface are capable of relative movement with respect to the corresponding regions of the substrate material at the first interface along a plane generally perpendicular to the direction.

13. The electronic interconnect device of claim 10 wherein the adhesion material includes a plurality of adhesion material portions individually bonded to the substrate material at the first interface and to the interconnect material at the second interface, the adhesion material portions being capable of relative movement with respect to one another.

14. The electronic interconnect device of claim 10 wherein the adhesion material includes a plurality of adhesion material portions individually bonded to the substrate material at the first interface and to the interconnect material at the second interface, the adhesion material portions are separated from one another by a distance.

15. The electronic interconnect device of claim 10 wherein the adhesion material has a thickness of about 3 nm to about 5 nm, and wherein the interconnect material has a thickness of about 100 nm to about 20µm.

16. The electronic interconnect device of claim 10 wherein:
    the substrate material includes a polymeric material;
    the adhesion material includes chromium (Cr) or an oxide thereof; and
    the interconnect material includes Indium (In).

17. An electronic interconnect device, comprising:
    a substrate material;
    an interconnect material proximate the substrate material, the interconnect material including a metal and having a first surface proximate the substrate material and a second surface opposite the first surface; and an adhesion material bonded with the substrate material at a first interface and bonded with the interconnect material at a second interface of the adhesion material, the interconnect material having regions at the second interface that are capable of relative movement with respect to corresponding regions of the substrate material without being delaminated from the adhesion material.

18. The electronic interconnect device of claim 17 wherein:
   the interconnect material is spaced apart from the substrate material along a first direction; and
   the regions of the interconnect material at the second interface are capable of relative movement with respect to the corresponding regions of the substrate material at the first interface along a second direction generally perpendicular to the first direction.

19. The electronic interconnect device of claim 17 wherein:
   the interconnect material is spaced apart from the substrate material along a direction; and
   the regions of the interconnect material at the second interface are capable of relative movement with respect to the corresponding regions of the substrate material at the first interface along a plane generally perpendicular to the direction.

20. The electronic interconnect device of claim 17 wherein the adhesion material includes a plurality of adhesion material portions individually bonded to the substrate material at the first interface and to the interconnect material at the second interface, the adhesion material portions being capable of relative movement with respect to one another.

* * * * *